(12) United States Patent
Lo

(10) Patent No.: US 10,776,279 B2
(45) Date of Patent: Sep. 15, 2020

(54) DATA STORAGE SYSTEM AND CALIBRATION METHOD FOR OPERATIONAL INFORMATION USED IN CONTROLLING NON-VOLATILE MEMORY

(71) Applicant: Silicon Motion, Inc., Jhubei, Hsinchu County (TW)

(72) Inventor: Chun-Yi Lo, New Taipei (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

(21) Appl. No.: 16/170,265

(22) Filed: Oct. 25, 2018

(65) Prior Publication Data
US 2019/0332547 A1  Oct. 31, 2019

(30) Foreign Application Priority Data
Apr. 27, 2018  (TW) ............... 107114492 A

(51) Int. Cl.
*G06F 12/10* (2016.01)
*G06F 3/06* (2006.01)
(52) U.S. Cl.
CPC ............ *G06F 12/10* (2013.01); *G06F 3/0604* (2013.01); *G06F 3/0632* (2013.01); *G06F 3/0659* (2013.01); *G06F 3/0679* (2013.01); *G06F 2212/1044* (2013.01); *G06F 2212/657* (2013.01)

(58) Field of Classification Search
CPC ...... G06F 12/10; G06F 3/0604; G06F 3/0632; G06F 3/0659; G06F 3/0679; G06F 2212/1044; G06F 2212/657
See application file for complete search history.

(56) References Cited

U.S. PATENT DOCUMENTS

| | | | |
|---|---|---|---|
| 8,760,922 B2 | 6/2014 | Lassa | |
| 8,949,483 B1 | 2/2015 | Owen | |
| 2007/0033323 A1 | 2/2007 | Gorobets | |
| 2010/0017556 A1 | 1/2010 | Chin et al. | |
| 2016/0077903 A1* | 3/2016 | Reddy | G11C 16/349 714/704 |
| 2017/0249091 A1* | 8/2017 | Hodes | G06F 3/0611 |
| 2018/0365160 A1* | 12/2018 | Jiang | G06F 12/109 |
| 2019/0189227 A1* | 6/2019 | Yang | G11C 16/349 |

FOREIGN PATENT DOCUMENTS

CN       101233481 B     2/2013

\* cited by examiner

*Primary Examiner* — Masud K Khan
(74) *Attorney, Agent, or Firm* — McClure, Qualey & Rodack, LLP

(57) ABSTRACT

A technology for calibrating device-end operational information of a data storage system is shown. A controller operates a non-volatile memory with reference to operational information. A second type of logical address requested by the host that is different from the first type of logical address used in operating a file system of a host is introduced. As indicated by the second type of logical address, the controller receives calibration information from the host and calibrates the operational information based on the calibration information.

22 Claims, 3 Drawing Sheets

20180427

DATA STORAGE SYSTEM AND CALIBRATION METHOD FOR OPERATIONAL INFORMATION USED IN CONTROLLING NON-VOLATILE MEMORY

CROSS REFERENCE TO RELATED APPLICATIONS

This Application claims priority of Taiwan Patent Application No. 107114492, filed on Apr. 27, 2018, the entirety of which is incorporated by reference herein.

BACKGROUND OF THE INVENTION

Field of the Invention

The present invention relates to data storage devices and methods for operating non-volatile memory.

Description of the Related Art

There are various forms of non-volatile memory (NVM) for long-term data retention, such as flash memory, magnetoresistive RAM, ferroelectric RAM, resistive RAM, spin transfer torque-RAM (STT-RAM), and so on.

The operations of non-volatile memory rely on a variety of operational information. How to ensure the accuracy of the operational information is an important issue in the technical field.

BRIEF SUMMARY OF THE INVENTION

A calibration technique for operational information collected to control a non-volatile memory is shown.

A data storage system in accordance with an exemplary embodiment of the disclosure has a non-volatile memory and a controller. The controller operates a non-volatile memory with reference to operational information. A second type of logical address is introduced which is different from a first type of logical address used in operating a file system of a host. As indicated by the second type of logical address requested by the host, the controller receives calibration information from the host and calibrates the operational information based on the calibration information.

In an exemplary embodiment, the controller and the host communicate through a non-volatile memory express (NVMe) interface. The non-volatile memory express (NVMe) interface defines a logic range type. When recognizing a command code indicating the logic range type, the controller determines that the second type of logical address is requested and calibrates the operational information rather than being operated by the file system of the host.

In an exemplary embodiment, the operational information shows temperature, and the calibration information shows the results of the temperature measurement provided by the host.

In another exemplary embodiment, the non-volatile memory is a flash memory, the operational information shows erase counts, and the calibration information shows a memory condition about erasure that is estimated by the host.

In another exemplary embodiment, a calibration method to be performed at the device side is shown, which calibrates operational information required in operating a non-volatile memory. A second type of logical address requested by the host that is different from a first type of logical address used in operating a file system of a host is recognized in the calibration method to get calibration information from the host. The calibration method calibrates the operational information based on the calibration information.

In another exemplary embodiment, a calibration method to be performed at the host side is shown, which calibrates operational information required in operating a non-volatile memory. A second type of logical address is introduced that is different from the first type of logical address used in operating a file system. According to the calibration method performed at the host side, a request for the second type of logical address is output to a controller of the non-volatile memory, and calibration information indicated by the second type of logical address is output to the controller for the controller to calibrate the operational information based on the calibration information.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
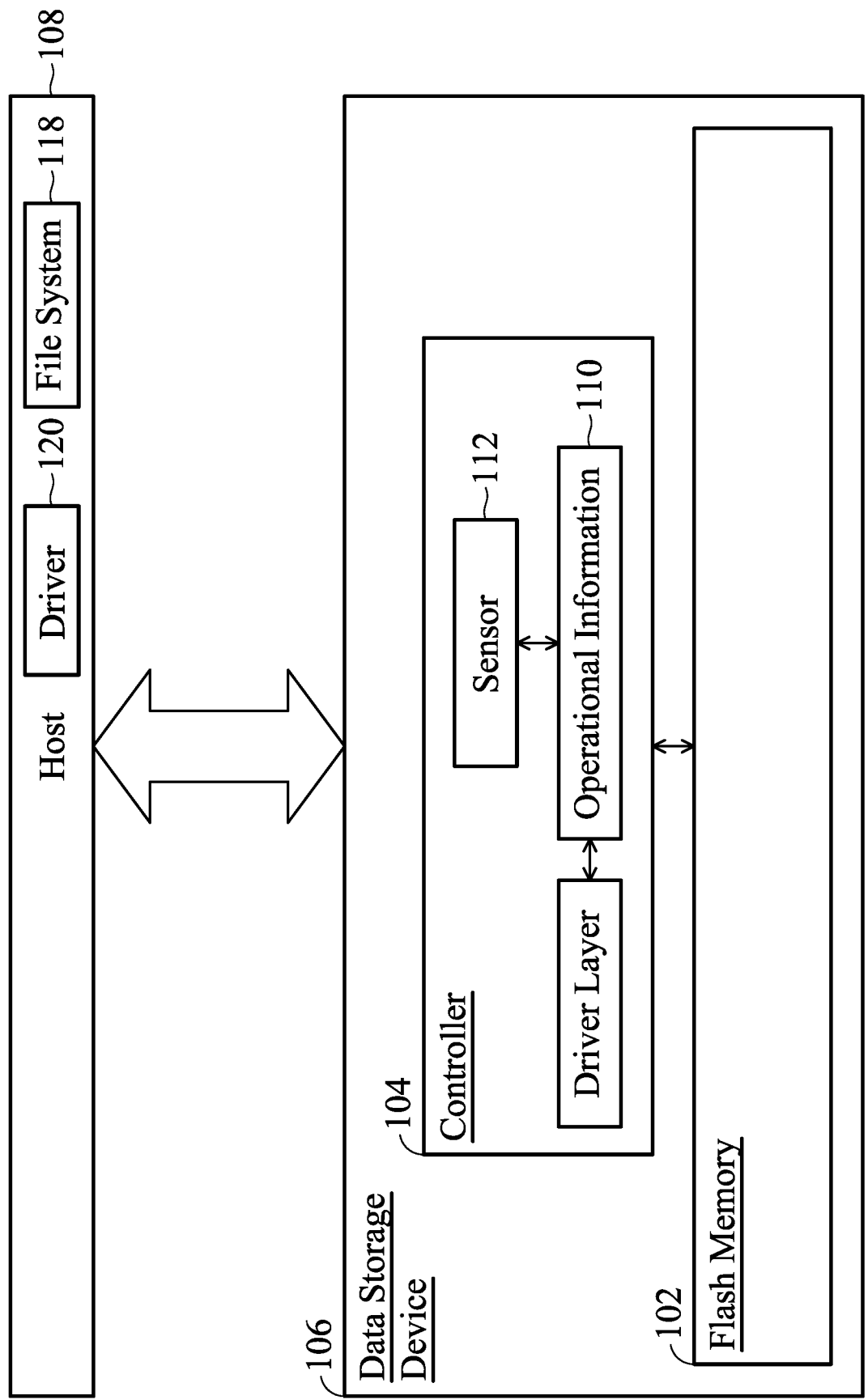
FIG. 1 illustrates a data storage system in accordance with an embodiment of the present invention.

The following description shows exemplary embodiments of carrying out the invention. This description is made for the purpose of illustrating the general principles of the invention and should not be taken in a limiting sense. The scope of the invention is best determined by reference to the appended claims.

A non-volatile memory for long-term data retention may be a flash memory, a magnetoresistive RAM, a ferroelectric RAM, a resistive RAM, a spin transfer torque-RAM (STT-RAM) and so on. A non-volatile memory may be used to implement a data storage device or a data center. The following discussion uses flash memory as an example.

Flash memory is often used as a storage medium in today's data storage devices. Flash memory is often implemented in memory cards, USB flash devices, SSDs, and so on. In another exemplary embodiment, a flash memory may be packaged with a controller to form a multiple-chip package named eMMC.

A data storage device using a flash memory as a storage medium can be applied in a variety of electronic devices, including a smartphone, a wearable device, a tablet computer, a virtual reality device, etc. A calculation module of an electronic device may be regarded as a host that operates a data storage device equipped on the electronic device to access a flash memory within the data storage device.

A data center may be built with data storage devices using flash memories as the storage medium. For example, a server may operate an array of SSDs to form a data center. The server may be regarded as a host that operates the SSDs to access the flash memories within the SSDs.

A file system operated by the host distinguishes user data by logical addresses (for example, according to a logical block address LBA, a global host page number GHP, a host block number HB1k, or a host page number HPage, etc.). The storage space of flash memory is dynamically allocated to store user data. After writing user data to the flash memory, the mapping relationship between the logical address of the user data and the physical space storing the user data is recorded. When the file system requests to read the user data, the flash memory is searched based on the recorded mapping relationship and thereby the requested user data is read from the flash memory. In addition to the read requests from the file system, many other operations of the flash memory need to use the mapping relationship.

The storage space of a flash memory is divided into blocks with each block including pages. User data may be written to a block page by page. Instead of being overwritten on the space storing old data, the updated version of user data is written to the spare space. The old data is invalidated after the update. The block with only invalid data remaining is erased to be reused. An erasure operation is performed in block units. The number of erasures allowed to be performed on each block has an upper limit. A block with an erase count exceeding a threshold should be protected from write operations. When the total number of blocks with the excessive erase counts reaches a threshold amount, the flash memory is marked as damaged to avoid more write operations. This mechanism will ensure that user data is not lost.

Flash memory may additionally be controlled based on temperature. Hot temperatures will initiate a cooling action.

As the above paragraphs indicate, a flash memory operates based on a variety of information (e.g., a mapping table managing mapping relationships, erase counts of the different blocks, temperature, and so on) which is hereinafter referred to as operational information. In addition to the foregoing, there are many kinds of operational information affecting the operations of the flash memory. Calibration techniques for any of the operational information are disclosed in the present invention.

FIG. 1 illustrates a data storage system in accordance with an embodiment of the present invention. A data storage device 106 includes a flash memory 102 and a controller 104, and preferably operates according to commands from a host 108. A data storage architecture including the flash memory 102 and the controller 104 without including the host 108, or a data storage architecture including the flash memory 102, the controller 104 and the host 108 all as shown both are both considered within the scope of the present invention.

The flash memory 102 is controlled by the controller 104 in response to management commands or access commands issued by a file system 118 of the host 108. Operational information 110 is recorded in the controller 104. When operating the flash memory 102, the controller 104 dynamically updates the operational information 110. In an exemplary embodiment, to manage various mapping tables of the flash memory 102, the required information may be updated section by section on the controller 104 as the dynamically updated operational information. In another exemplary embodiment, the operational information 110 includes the erase count of each block. The erase counts are dynamically managed on the controller 104 and updated to the flash memory 102. In another exemplary embodiment, the controller 104 has a sensor 112 and the information sensed by the sensor 112 may be dynamically updated on the controller 104 as the operational information 110. The sensor 112 may be a thermometer and the measured temperature may be recorded on the controller 104 as the operational information 110. The controller 104 operates the flash memory 102 based on the operational information 110. In some exemplary embodiments, the controller 104 records time stamps of the measured operational information on the flash memory 102.

In the present invention, a calibration technique for the operational information 110 is shown. A driver 120 at the host 108 transfers calibration information to the controller 104. The driver 120 indicates the calibration information by logical addresses that are irrelevant to (not used or unallocated by) the file system 118 of the host 108. Based on the received calibration information, the controller 104 calibrates the operational information 110. The controller 104 returns the calibration result or whether the calibration successes (e.g. a calibration success message or a calibration failure message) to the driver 120. When the calibration fails, the driver 120 provides the operating system of the host 108 with a warning message.

Figure 2:
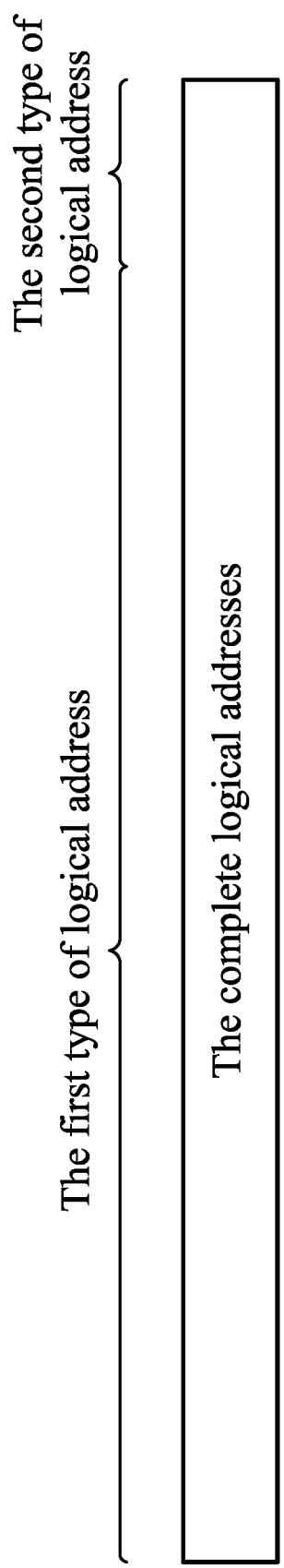
FIG. 2 shows two types of logical address in the present invention.

In details, as shown in FIG. 2, there are two types of logical address in the present invention. The first type of logical address is allocated or used by the file system 118, for example, logical addresses from 0x0000000 to 0x3D08FFF corresponding to user data accessed by the operating system. The second type of logical address is allocated or used by the driver 120. For example, a logical address 0x3D09000 is allocated by the driver 120 to provide calibration information to the controller 104. The different types of logical address do not overlap. The file system 118 preferably does not know the existence of the second type of logical address. In another exemplary embodiment, the driver 120 informs the file system 118 of the existence of the second type of logical address. After the driver 120 notifies the controller 104 of the existence of the second type of logical address, the driver 120 can use the second type of logical address to indicate the transfer of the calibration information. In this manner, the calibration information is transferred to the controller 104. When receiving an access command that indicates the second type of logical address, the controller 104 starts the calibration process. The controller 104 receives the calibration information indicated by the second type of logical address and calibrates the operational information 110 based on the calibration information. In the present invention, the calibration process is performed periodically or when a preset criterion is satisfied. The calibration process is automatically performed or passively requested without affecting the operations of the file system 118. During the calibration of the operational information in the present invention, the interference on the file system 118 generated by the calibration is minimized.

In an exemplary embodiment, the data storage device 106 is connected to the host 108 via a PCIe (peripheral component interconnect express) bus and communicates with the host 108 through an NVMe (non-volatile memory express) interface.

Figure 3:
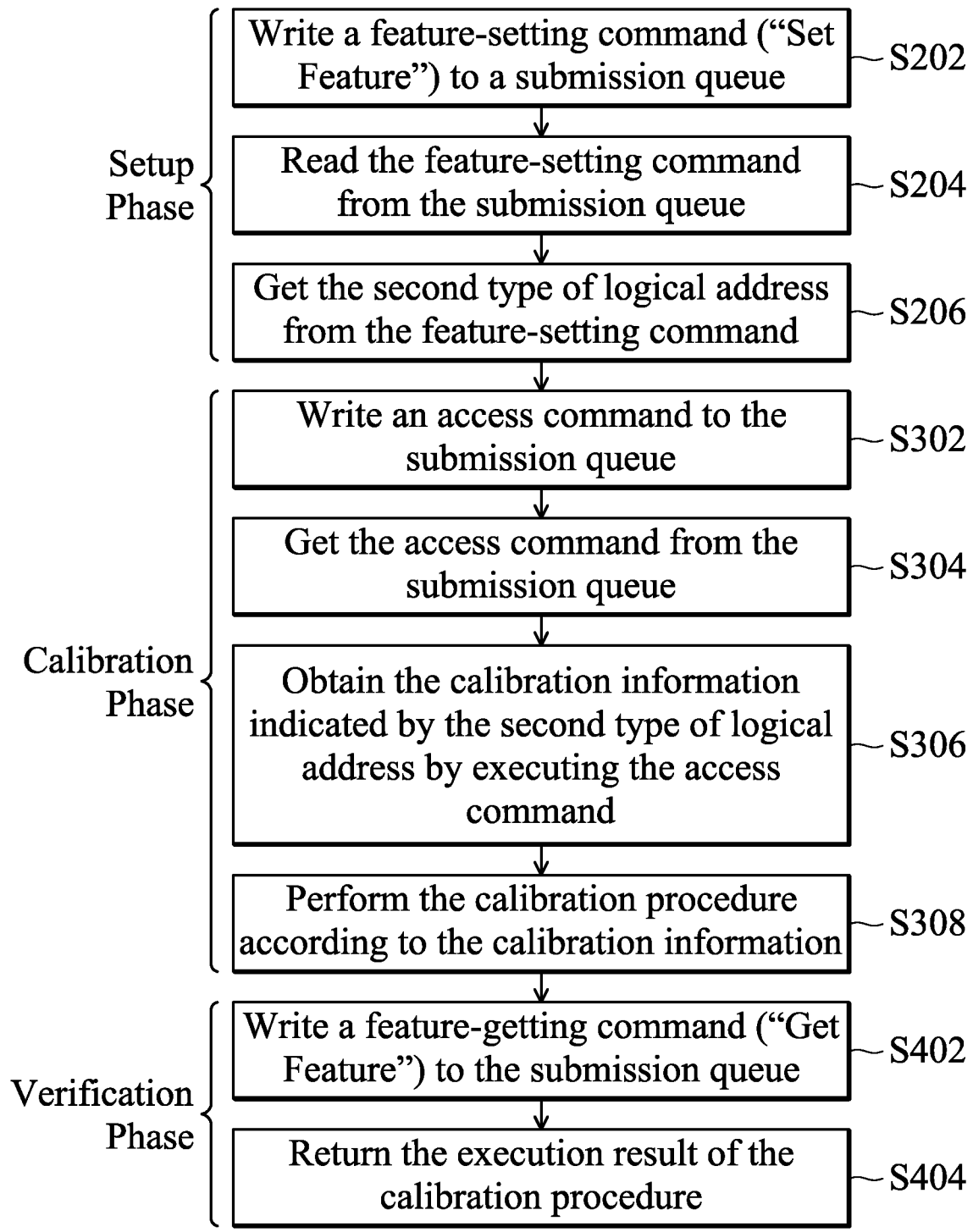
FIG. 3 is a flowchart depicting a calibration method for operational information 110 in accordance with an exemplary embodiment of the present invention, including a setup phase, a calibration phase, and a verification phase.

FIG. 3 is a flowchart depicting a calibration method for operational information 110 in accordance with an exemplary embodiment of the present invention, including a setup phase, a calibration phase, and a verification phase. In the setup phase, the driver 120 notifies the data storage device 106 of the information about the second type of logical address, including address, attributes, numbers, and the like. In the calibration phase, the driver 120 outputs the second type of logical address and calibration information to the data storage device 106, and the data storage device 106 calibrates the operational information 110 based on the calibration information. In the verification phase, the data storage device 106 transfers the calibration result (success or failure) to the driver 120. In an exemplary embodiment, the calibration method for the operational information 110 is initiated when the data storage device 106 detects an abnormal condition, such as finding no mapping information, locked card (due to a large number of blocks exceeding the upper limit of the erase count), or overheating warning. In other exemplary embodiments, the calibration method may be initiated periodically or when a preset criterion is satisfied. The operational information 110, therefore, is calibrated in a routine.

In step S202, the driver 120 of the host 108 writes a feature-setting command ("Set Feature") to a submission queue. The feature-setting command indicates parameters such as a command code, a command number, a namespace number, a feature number, a memory address, a logical address length, and so on. The driver 120 sets the command code to show that the feature-setting command should be interpreted as indicating a predefined logical range type (e.g. a predefined type of LBA range). The driver 120 sets the logical address length to be 1. After setting the parameters, the driver 120 writes the feature-setting command to the submission queue.

In step S204, the controller 104 of the data storage device 106 reads the feature-setting command from the submission queue. The controller 104 reads the command code to know that the feature-setting command indicates a logical range type (e.g. a type of LBA range) that defines an additional logical address (for example: 0x3D09000) which is also known as the second type of logical address.

In step S206, the controller 104 of the data storage device 106 obtains the additional logical address from the feature-setting command. According to the memory address indicated in the feature-setting command, the controller 104 gets the parameters about the additional logical address, including the address, the type, and so on. The controller 104 determines whether the parameters indicated by the feature-setting command and the parameters stored in the indicated memory address are normal. When all parameters are normal and the execution of the feature-setting command finishes, the controller 104 writes a completion element to a completion queue. The driver 120 reads the completion element and thereby determines that the feature-setting command has been successfully executed.

In step S302, the driver 120 at the host 108 writes an access command to the submission queue. In an exemplary embodiment, a write command is requested as an access command, which indicates the second type of logical address (0x3D09000) set in the setup phase and is for transfer of the calibration information (e.g. a temperature value 25).

In step S304, the controller 104 of the data storage device 106 gets the access command from the submission queue.

In step S306, the controller 104 of the data storage device 106 obtains the calibration information indicated by the second type of logical address by executing the access command.

In step S308, the controller 104 of the data storage device 106 performs the calibration procedure according to the calibration information. For example, the calibration procedure is performed when the sensor 112 cannot measure the temperature or the measured temperature value (e.g., 35) and the calibration information has a considerable difference. In the calibration procedure, the controller 104 uses the calibration information to correct (or to replace) the temperature value measured by the sensor 112. The calibration result (success or failure) is recorded. The calibration procedure is not limited to any particular scheme and is not explained here. In another exemplary embodiment, the temperature range sensed at the host 108 side is regarded as calibration information. The controller 104 performs temperature calibration based on the temperature range detected at the host 108 side. The controller 104 adjusts the temperature values collected as the operational information 110 in a time period to the temperature range detected at the host 108 side and, accordingly, the subsequently sensed temperature values are shifted in the same way.

In step S402, the driver 120 at the host 108 side writes a feature-getting command ("Get Feature") to the submission queue. The feature-getting command includes parameters such as a command code, a command number, a namespace number, a feature number, a memory address, and so on.

In step S404, the controller 104 of the data storage device 106 returns the execution result of the calibration procedure. The controller 104 stores the calibration result to a memory according to the memory address specified by the feature-getting command, and writes the corresponding completion element to the completion queue. The driver 120 reads the completion element and thereby knows whether the feature-getting command has been successfully executed. The driver 120 reads the calibration result according to the memory address.

In an exemplary embodiment, when the operational information 110 fails to be calibrated, the controller 104 attempts the calibration several times. Step S308 is repeated till an upper limit number of repeating is reached. For example, there are N chances for calibration, where N is a number (e.g., 5 times).

In another exemplary embodiment, the erasure limitation that affects the operations of the flash memory 102 is discussed. The upper limit of the erase count may be 5000. The controller 104 may regard a block having an erase count exceeding the upper limit as a bad block and a bad block is no longer being used. According to the calibration method for operational information 110 of the present invention, the user can modify the erase count to change a bad block to a normal block. First, in the setup phase, a second type of logical address (e.g., 0x3D09001) is assigned to correspond to the calibration information. In the calibration phase, a value, 1000, is transferred to the controller 104 as calibration information. The controller 104 subtracts the value, 1000, from the recorded erase count. The block that was regarded as a bad block due to the considerable erase count, 5000, is changed to correspond to an erase count of 4000. Because 4000 is below the upper limit of the erase count, the controller 104 now regards the block as a normal block. When fewer blocks are regarded as bad blocks, the driver 120 at the host 108 side is allowed to read user data from the unlocked blocks (or the access protection of the data storage device 106 is unlocked). In another embodiment, the host 108 estimates an erase count range as the calibration information for the erase count. The controller 104 calibrates the erase counts according to the estimated range. The erase counts recorded as the operational information 110 are modified to the estimated range and, therefore, the subsequent counting for the erase count is affected.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage system, comprising:
   a non-volatile memory; and
   a controller, operating the non-volatile memory with reference to operational information,
   wherein:
   a second type of logical address requested by a host is introduced that is different from a first type of logical address used in operating a file system of a host;
   as indicated by the second type of logical address requested by the host, the controller receives calibration information from the host and calibrates the operational information based on the calibration information; and
   from a command code of a feature-setting command requested by the host, the controller recognizes that the feature-setting command is informing the second type of logical address and thereby gets the second type of logical address.

2. The data storage system as claimed in claim 1, wherein:
   the controller and the host communicate through a non-volatile memory express (NVMe) interface; and
   when recognizing a command code indicating a logic range type defined for the non-volatile memory express (NVMe) interface, the controller determines that the second type of logical address is requested and calibrates the operational information rather than being operated by the file system of the host.

3. The data storage system as claimed in claim 1, wherein:
   from an access command requested by the host and indicating the second type of logical address, the controller recognizes that the access command transfers the calibration information and calibrates the operational information based on the calibration information.

4. The data storage system as claimed in claim 3, wherein:
   in response to a feature-getting command requested by the host, the controller sends a calibration success message or a calibration failure message to the host.

5. The data storage system as claimed in claim 4, wherein:
   the controller repeats up to N times to calibrate the operational information based on the calibration information, where N is a number.

6. The data storage system as claimed in claim 1, wherein:
   the operational information shows temperature; and
   the calibration information shows results of temperature measurement provided by the host.

7. The data storage system as claimed in claim 6, wherein:
   a temperature range measured by the host is provided as the calibration information; and
   the controller calibrates temperature based on the temperature range to modify temperature values recorded as the operational information in a past time period to the temperature range and thereby calibrates the subsequent temperature determination.

8. The data storage system as claimed in claim 1, wherein:
   the non-volatile memory is a flash memory;
   the operational information shows erase counts; and
   the calibration information shows a memory condition about erasure that is estimated by the host.

9. The data storage system as claimed in claim 8, wherein:
   an estimated range about erase count is estimated by the host and provided by the host as the calibration information; and
   the controller calibrates erase counts based on the estimated range to modify records of erase counts collected as the operational information in a past time period to the estimated range and thereby calibrates the subsequent erasure counting.

10. A calibration method for calibrating operational information required in operating a non-volatile memory, comprising:
    recognizing a second type of logical address requested by a host that is different from a first type of logical address used in operating a file system of a host to get calibration information from the host;
    calibrating the operational information based on the calibration information, and
    from a command code of a feature-setting command requested by the host, recognizing that the feature-setting command is informing the second type of logical address and thereby gets the second type of logical address.

11. The calibration method as claimed in claim 10, further comprising:
    when recognizing a command code indicating a logic range type defined for a non-volatile memory express (NVMe) interface, determining that the second type of logical address is requested and calibrating the operational information rather than being operated by the file system of the host,
    wherein the non-volatile memory communicates to the host through the non-volatile memory express (NVMe) interface.

12. The calibration method as claimed in claim 10, further comprising:
    from an access command requested by the host and indicating the second type of logical address, recognizing that the access command transfers the calibration information and calibrating the operational information based on the calibration information.

13. The calibration method as claimed in claim 12, further comprising:
    in response to a feature-getting command requested by the host, sending a calibration success message or a calibration failure message to the host.

14. The calibration method as claimed in claim 13, further comprising:
    repeating up to N times to calibrate the operational information based on the calibration information, where N is a number.

15. The calibration method as claimed in claim 10, wherein:
    the operational information shows temperature; and
    the calibration information shows results of temperature measurement provided by the host.

16. The calibration method as claimed in claim 15, further comprising:
    calibrating temperature based on a temperature range to modify temperature values recorded as the operational information in a past time period to the temperature range and thereby calibrates the subsequent temperature determination,
    wherein the temperature range is measured by the host to be provided as the calibration information.

17. The calibration method as claimed in claim 10, wherein:
    the non-volatile memory is a flash memory;
    the operational information shows erase counts; and
    the calibration information shows a memory condition about erasure that is estimated by the host.

18. The calibration method as claimed in claim 17, further comprising:

calibrating erase counts based on an estimated range about erase count, to modify erase counts recorded as the operational information in a past time period to the estimated range and thereby calibrates the subsequent erasure counting, wherein the estimated range about erase count is estimated by the host and provided by the host as the calibration information.

19. A calibration method for calibrating operational information required in operating a non-volatile memory, comprising:

using a second type of logical address to operate a controller of the non-volatile memory that is different from a first type of logical address used in operating a file system;

using the second type of logical address to indicate and provide calibration information to the controller and thereby the controller calibrates the operational information based on the calibration information; and requesting a feature-setting command with a command code to be recognized by the controller and thereby the controller determines that the feature-setting command is informing the second type of logical address and thereby the controller gets the second type of logical address.

20. The calibration method as claimed in claim 19, further comprising:

operating a non-volatile memory express (NVMe) interface; and transmitting a command code that indicates a logic range type defined for the non-volatile memory express (NVMe) interface to the controller and thereby the controller determines that the second type of logical address is requested to calibrate the operational information rather than being operated by the file system.

21. The calibration method as claimed in claim 19, further comprising:

requesting an access command that indicates the second type of logical address to be recognized by the controller and thereby the controller determines that the access command transfers the calibration information and thereby the controller calibrates the operational information based on the calibration information.

22. The calibration method as claimed in claim 21, further comprising:

requesting a feature-getting command and thereby the controller returns a calibration success message or a calibration failure message.

* * * * *